United States Patent
Kamath et al.

(10) Patent No.: US 7,342,797 B2
(45) Date of Patent: *Mar. 11, 2008

(54) INTERPOSABLE HEAT SINK FOR ADJACENT MEMORY MODULES

(75) Inventors: Vinod Kamath, Raleigh, NC (US); Beth F. Loebach, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/746,322

(22) Filed: May 9, 2007

(65) Prior Publication Data

US 2007/0201212 A1    Aug. 30, 2007

Related U.S. Application Data

(63) Continuation of application No. 11/093,445, filed on Mar. 30, 2005, now Pat. No. 7,289,331.

(51) Int. Cl.
*H05K 7/20* (2006.01)
(52) U.S. Cl. ............... 361/721; 361/704; 361/715; 361/719
(58) Field of Classification Search ............ None
See application file for complete search history.

(56) References Cited

U.S. PATENT DOCUMENTS 6,088,228 A * 7/2000 Petersen et al. ........... 361/720
6,349,035 B1 * 2/2002 Koenen ..................... 361/719
6,762,942 B1 * 7/2004 Smith ........................ 361/749
7,023,701 B2 * 4/2006 Stocken et al. ............. 361/704
2006/0203454 A1 * 9/2006 Chang ....................... 361/707

\* cited by examiner

*Primary Examiner*—Boris Chervinsky
(74) *Attorney, Agent, or Firm*—Synnestvedt & Lechner LLP; Cynthia Byrd

(57) ABSTRACT

A heat sink device for conventional memory modules, such as DIMMs, that is configured to be positioned between adjacent memory modules mounted in substantially parallel connectors on a printed circuit board. Each heat sink device includes thermally conductive first and second members configured to thermally couple with electronic components of a conventional memory module. The first and second members may be resiliently biased away from one another so that the resilient bias causes the members to abut respective electronic components when placed between adjacent memory modules. A separate wedge, or a lever-mounted wedge, may be provided for insertion between the members to urge them away from one another and into abutting relationship with electronic components on facing surfaces of the adjacent memory modules. When abutting opposing electronic components, a single heat sink device facilitates heat dissipation from both of the adjacent memory modules.

13 Claims, 4 Drawing Sheets

INTERPOSABLE HEAT SINK FOR ADJACENT MEMORY MODULES

CROSS-REFERENCE TO RELATED APPLICATION

This application is a continuation of U.S. application Ser. No. 11/093,445, filed Mar. 30, 2005, now U.S. Pat. No. 7,289,331 the entire disclosure of which is hereby incorporated herein by reference.

FIELD OF THE INVENTION

The present invention relates generally to a heat sink device configured to dissipate heat from electronic components of a conventional memory module, such as a SIMM or DIMM.

DISCUSSION OF RELATED ART

Conventional memory modules include multiple individual memory chips arranged on a printed circuit board that is configured to mate with a conventional connector of a motherboard of a PC, etc. Such conventional memory modules conform to industry standards of size, configuration etc. Exemplary memory modules include SIMMs and DIMMs.

Recent increases in the integration density of memory integrated circuits on memory modules, and the development of newer memory ICs, such as DDR2 ICs, have resulted in memory modules that run "hotter." Further, many vendors of conventional memory modules have lowered the DIMM junction temperature specifications while power requirements have increased. Further still, newer CPUs are tending to run hotter, and the memory modules are receiving preheated air from the exhaust of the CPU's heat sink, making it more difficult to cool memory modules in a conventional manner.

An exemplary conventional module is shown in FIGS. 1 and 2, which are diagrammatic plan and side views of the memory module. As shown in FIGS. 1 and 2, the memory module is generally designated with reference number 10, and includes a number of packaged memory ICs 12 and a plurality of chip-type capacitors 14 mounted on each face of a printed circuit board 16. The printed circuit board 16 has an array of contacts 18 provided along a long-side edge of each face of the printed circuit board 16 for electrical connection with an appropriate mating socket of a motherboard, etc.

As seen from FIGS. 1 and 2, the semiconductor memory ICs 12 and the chip-type capacitors 14 are mounted on each face of the printed circuit board 16 (in a DIMM), and the memory module 10 is inserted into a connector slot (not shown) within a system such as a personal computer or other information processing system. Therefore, heat generated in the memory ICs 12 is radiated from only the surface of the memory ICs 12.

SUMMARY OF THE INVENTION

The present invention provides a heat sink device for conventional memory modules, such as DIMMs, that is configured to be interposed between adjacent memory modules, and to dissipate heat from separate, adjacent memory modules.

The heat sink device includes thermally conductive first and second members. Each member has a respective surface configured to thermally couple with electronic components of a conventional memory module.

In one embodiment, the first and second members are resiliently biased away from one another. When placed between adjacent memory modules mounted in substantially parallel connectors on a printed circuit board, the resilient bias causes the first and second members of the heat sink device to abut respective electronic components on opposed surfaces of the adjacent memory modules.

In another embodiment, a separate wedge member, or a lever-mounted wedge member is driven between the first and second members to urge them away from one another and into abutting relationship electronic components on opposed surfaces of the adjacent memory modules.

When abutting opposing electronic components, a single heat sink device facilitates heat dissipation from both of the adjacent memory modules.

BRIEF DESCRIPTION OF THE DRAWINGS

The present invention will now be described by way of example with reference to the following drawings in which.

DETAILED DESCRIPTION OF THE PREFERRED EMBODIMENTS

The present invention provides a heat sink device configured to dissipate heat from electronic components of a conventional memory module, such as a DIMM. Unlike a conventional heat sink device that is attached directly to a memory in an "on-the-module" design, the present invention provides heat sink devices configured to be interposed between adjacent memory modules in a "between-the-modules" design.

Figure 1:
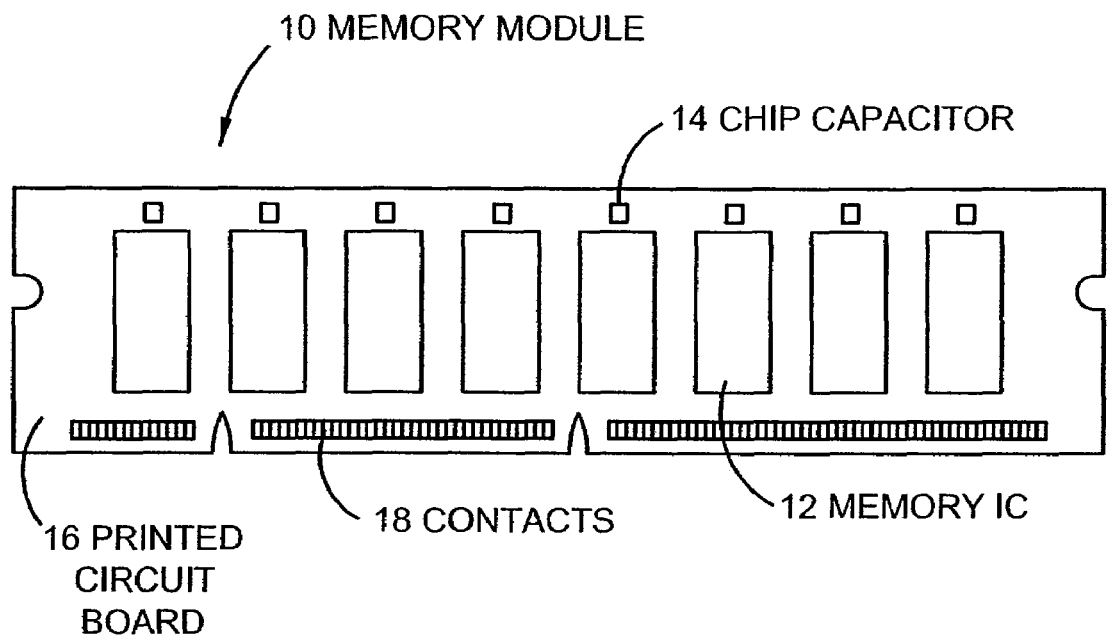
FIGS. 1 and 2 are diagrammatic plan and side views, respectively, of an exemplary memory module of the prior art.
Figure 2:
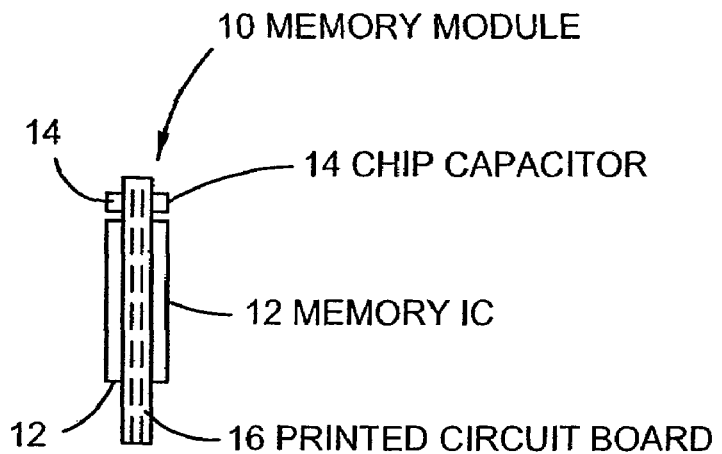
Figure 3:
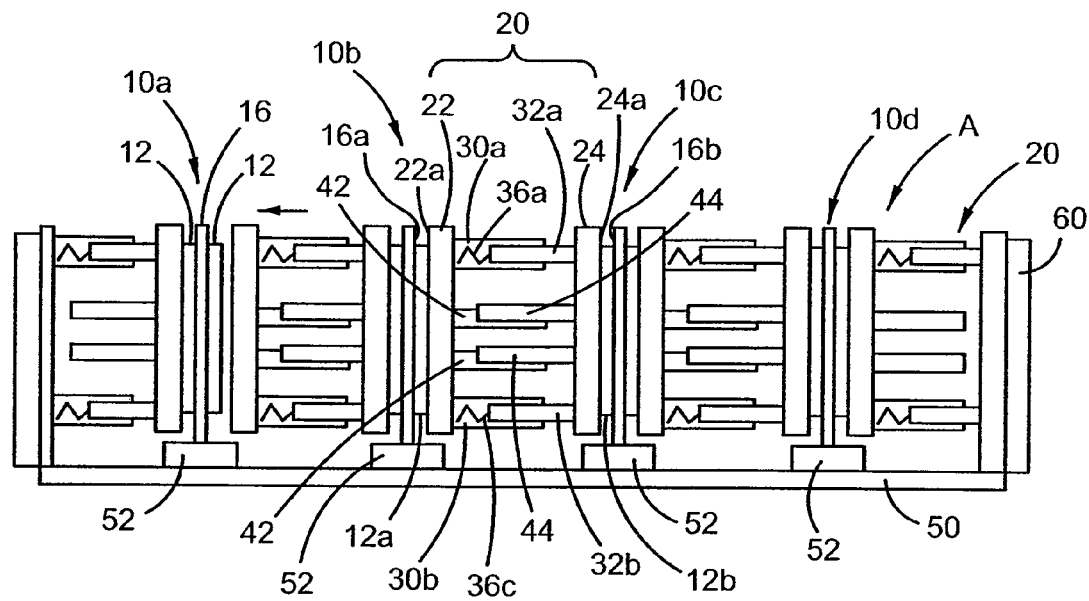
FIG. 3 is a diagrammatic side view of a plurality of heat sink devices according to a first embodiment of the present invention, shown interposed among an array of exemplary memory modules of FIGS. 1 and 2.
Figure 4:
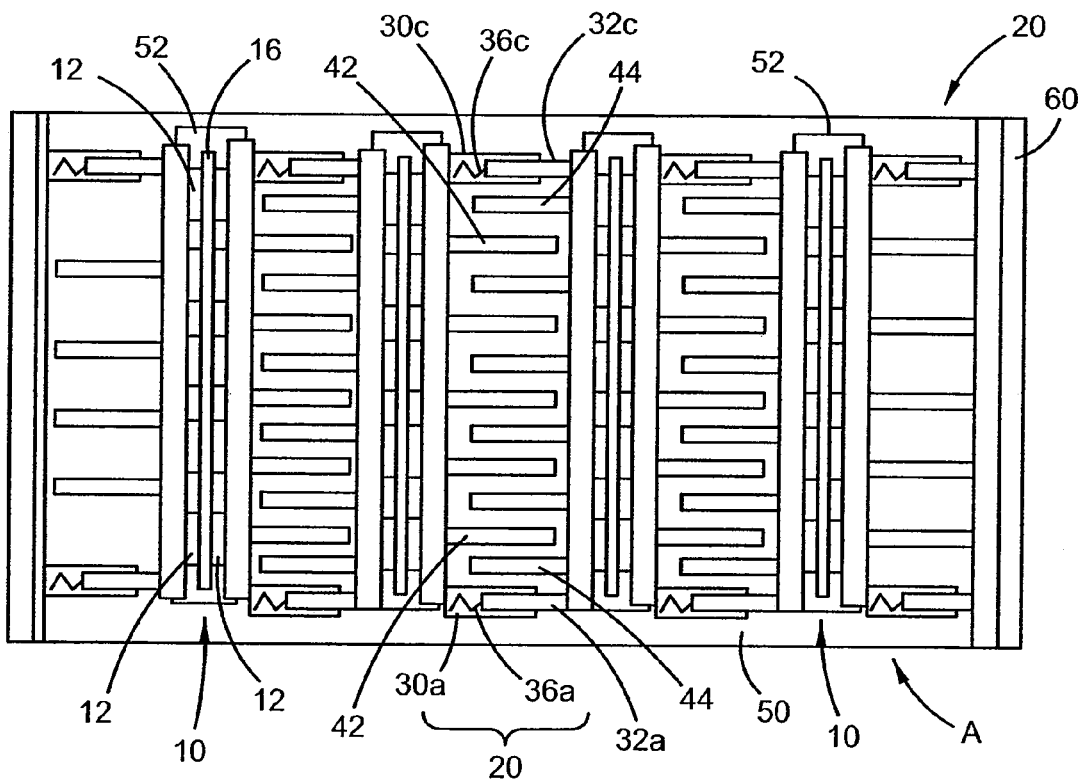
FIG. 4 is a diagrammatic top view of the heat sink devices and memory modules of FIG. 3.

Referring now to FIGS. 3 and 4, heat sink devices 20 in accordance with one embodiment of the present invention are shown. It will be appreciated from FIGS. 3 and 4 that the heat sink devices 20 are configured to dissipate heat from conventional memory modules, such as DIMMs, while further, the inventive heat sink devices 20 can be installed and used without any need for any modification to the conventional memory module, and without the need for any tools. Further still, the heat sink devices are configured to be fitted to conventional memory modules after such modules are mounted as conventional connectors of a printer circuit board, such connectors being relied upon to provide positional stability used in accordance with the present invention. Accordingly, the heat sink devices 20 are shown in a conventional environment, namely, among conventional memory modules 10a, 10b, 10c, 10d (DIMMs in FIGS. 3 and 4) that are supported in substantially parallel positions on adjacent connectors 52 of a printed circuit board 50, such as a motherboard of a PC or other information processing system.

Referring again to FIGS. 3 and 4, the heat sink devices 20 include first and second members 22, 24. Each member 22, 24 is constructed of a suitable thermally conductive material, such as copper or aluminum, and is thus suitable for use as a heat spreader or heat sink to facilitate heat dissipation and corresponding connective cooling of memory modules.

Each of the first and second members 22, 24, has a respective first surface 22a, 24a configured to thermally couple with electronic components of conventional memory modules e.g. memory ICs 12. The first surface 22a of the first member 22 will couple with electronic components of a first memory module (e.g. 10b) and the second surface 24a of the second member 24 will couple with electronic components of a second memory module (e.g. 10c), as discussed in greater detail below.

In this embodiment of the present invention, the first and second members 22, 24 are resiliently biased away from one another. This bias causes the first and second members 22, 24 to abut respective electronic components 12a, 12b on the opposed surfaces 16a, 16b of adjacent memory modules 10b, 10c. In other words, this bias facilitates wedging of the heat sink device 20 between adjacent memory modules. Accordingly, a single heat sink device 20 is used to dissipate heat from two adjacent memory modules.

In FIGS. 3 and 4, the first and second members 22, 24 are biased by a spring member 36 joined to one of the first and second members 22, 24. In this exemplary embodiment, the first member 22 includes a plurality of elongated sockets 30a, 30b, 30c, 30d. Further, the second member 24 includes a plurality of complementary elongated pins 32a, 32b, 32c, 32d, each riding in a respective socket. Alternatively, the first member 22 includes the pins and the second member 24 includes the sockets. In another alternative embodiment, each member includes at least one pin and at least one socket, and the other member includes complementary pins and sockets.

Preferably, each spring members 36a, 36b, 36c, 36d includes a coil spring, which optionally is generally conical in shape. Each spring member is preferably positioned within a respective socket, and optionally is joined to the pin or the socket, or both the pin and the socket. By way of example, each pin may include a peripheral groove for receiving and retaining a portion of the coil spring. Alternatively, the pin may be integrally formed with or mechanically joined to the pin or socket.

Preferably, each member 22, 24 includes a respective set of conductive fins 42, 44, to enhance the cooling effect provided by the heat sink device 20. The fins 42, 44 are preferably arranged on each member such that the fins 42 of the first member 22 are positioned to interleave with the fins 44 of the second member 24, as shown in FIGS. 3 and 4. This type of arrangement is preferred to allow the fins to be relatively long. i.e., longer than half of the distance between the members 22, 24. However, any suitable configuration of fins may be employed.

Optionally, the exemplary device 20 may also be used to cool a memory module on a periphery of an array of memory modules, i.e., where there is no second memory module between which the device 20 may be interposed. Such a memory module is shown at A in FIGS. 3 and 4. To use the device in this manner, the motherboard 50 or housing (not shown) of an information processing system, etc. may optionally be provided with a brace 60, such that the device 20 may be interposed between a memory module 10d and the brace 60, with the brace 60 acting as a substitute for an adjacent memory module.

In use, this embodiment of the heat sink device 20 is first squeezed to compress the spring member(s) move the first and second members 22, 24 toward one another. In this compressed state, the heat sink device 28 is readily manually positioned between adjacent memory modules 10b, 10c (or between a memory module 10d and a brace 60). Once positioned between adjacent memory modules 10b, 10c, the squeezing force is released to allow the spring member(s) 36a, 36b, 36c and 36d to resile. The resiling of the spring members causes the first and second members 22, 24 to move outwardly, away from one another, and into abutting relationship with the electronic components 12 of the adjacent memory modules 10b, 10c. This abutting relationship provides thermal coupling of the electronic components 12 with the heat sink device 20 to facilitate convective cooling of the memory modules 10a, 10b. Accordingly, the heat sink device 20 may be installed and retained in a tool free manner, without the need to modify a conventional memory module.

Figure 5:
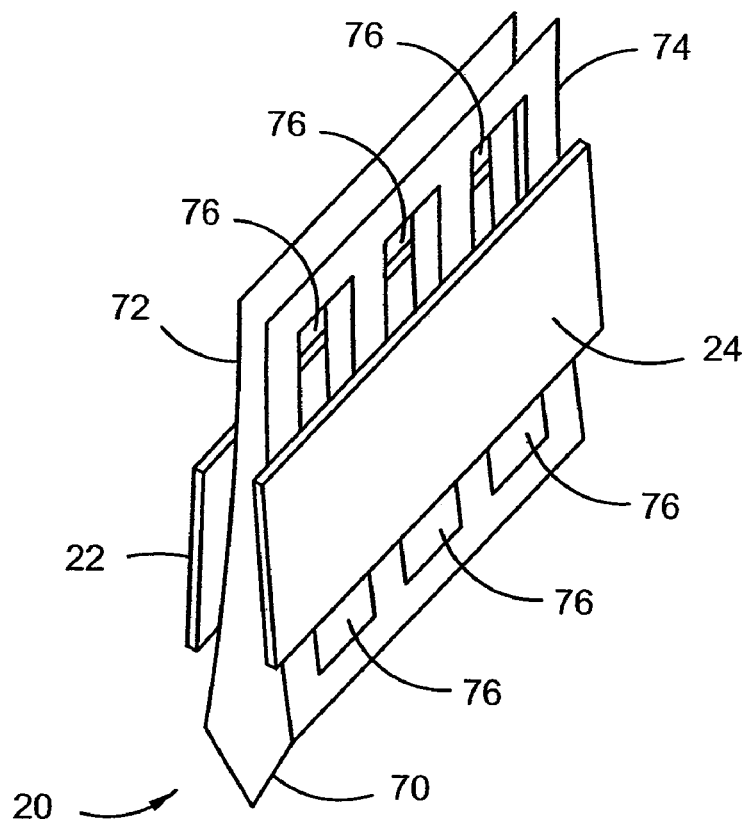
FIG. 5 is an alternative exemplary embodiment of a heat sink device in accordance with the present invention.

In the alternative embodiment of FIG. 5, the device 20 further includes a retention module 70. In one embodiment, the retention module 70 is made of a highly thermally conductive material such as copper or aluminum, i.e. a material similar to that of the members 22, 24. In an alternative embodiment, the retention module 70 is made of a material having a thermal conductivity less than that of the first and second members. Preferably, the retention module 70 is formed as a unitary body, e.g. by stamping and crimping sheet metal stock, by forming an injection molded body, etc.

The retention module 70 includes a pair of opposing legs 72, 74 to which the first and second members 22, 24 are mounted, e.g. by heat staking, mechanical fasteners, etc. Preferably, each of the legs 72, 74 defines a plurality of openings 76 for admitting passage of air adjacent the first and second members to facilitate convective cooling.

Figure 6:
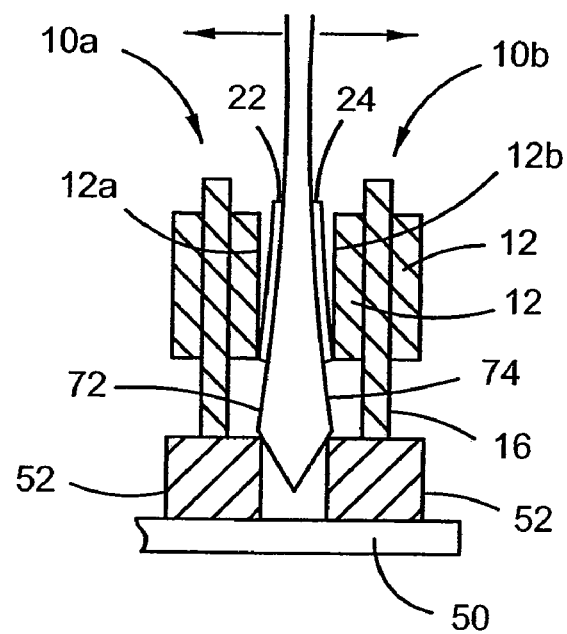
FIG. 6 is a diagrammatic side view of the exemplary heat sink device of FIG. 5, shown interposed between adjacent memory modules.

FIG. 6 is a diagrammatic side view of the exemplary heat sink device 20 of FIG. 5, shown interposed between adjacent memory modules 10a, 10b. In this embodiment, the legs 72, 74 are resiliently deflectable toward one another to resiliently bias the first and second members 22, 24 away from one another. More specifically, the retention module 70 is configured so that in its relaxed state it is not readily insertable between adjacent memory modules 10a, 10b. Instead, the legs 72, 74 are squeezed together (e.g. manually) during insertion of the head sink device 20 between adjacent memory modules 10a, 10b.

In use, this embodiment of the heat sink device 20 is first squeezed to resiliently deflect the legs 72, 74 inwardly and to move the first and second members 22, 24 toward one another. In this compressed state, the heat sink device 20 is readily manually positioned between adjacent memory modules 10a, 10b. Once positioned between adjacent memory modules 10a, 10b, the legs 72, 74 are permitted to resile. The resiling of the legs 72, 74 causes the first and second members 22, 24 to move outwardly, away from one another, and into abutting relationship with the electronic components 12a, 12b of the adjacent memory modules 10a, 10b. This resiling effectively wedges the heat sink device 20 between the adjacent memory modules, the heat sink being capable of retained in place by friction alone. This abutting relationship provides thermal coupling of the electronic components 12 with the heat sink device 20 to facilitate convective cooling of the memory modules 10a, 10b. Accordingly, the heat sink device 20 may be installed and retained in a tool free manner, without the need to modify a conventional memory module.

Figure 7:
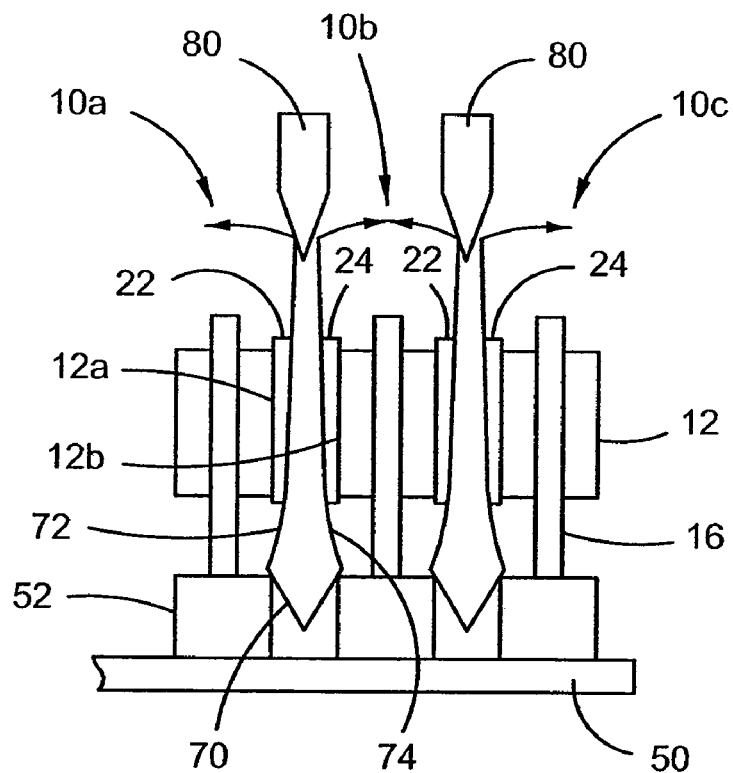
FIG. 7 is a diagrammatic side view of another alternative exemplary embodiment of a heat sink device in accordance with the present invention.

FIG. 7 is a side view of another alternative exemplary embodiment of a heat sink device in accordance with the present invention. This embodiment is similar to that of FIG. 6. However, in this embodiment, the retention module 70 is not configured to have, or to rely upon, outward resilient biasing of the module's legs 72, 74. Instead, the retention module 70 is configured to be readily insertable in its relaxed state between adjacent memory modules 10a, 10b, as shown in FIG. 7.

Accordingly, in the embodiment of FIG. 7, no tools and no squeezing force is required. In this embodiment, a wedge member 80 (FIG. 7) is selectively positionable between the first and second members 22, 24 to urge the first and second members away from one another and into abutting relationship with respective electronic components 12a, 12b of opposed/facing surfaces of adjacent memory modules 10a, 10b.

In this exemplary embodiment, the wedge member 80 is provided as a discrete member that is positionable between the opposing legs 72, 74 to urge the first and second members 22, 24 away from one another, e.g. by manually pressing the wedge 80 between the legs 72, 74.

In use, this embodiment of the retention module 70 is simply manually positioned between adjacent memory modules 10a, 10b. A wedge member 80 is then manually pressed between the legs 72, 74 to urge the first and second members 22, 24 away from one another and into abutting relationship with the electronic components 12a, 12b of the adjacent memory modules 10a, 10b. This provides thermal coupling of the electronic components 12a, 12b with the heat sink device 20 to facilitate convective cooling of the memory modules 10a, 10b.

Accordingly, the heat sink device 20 may be installed and retained in a tool free manner, without the need to modify a conventional memory module.

Figure 8:
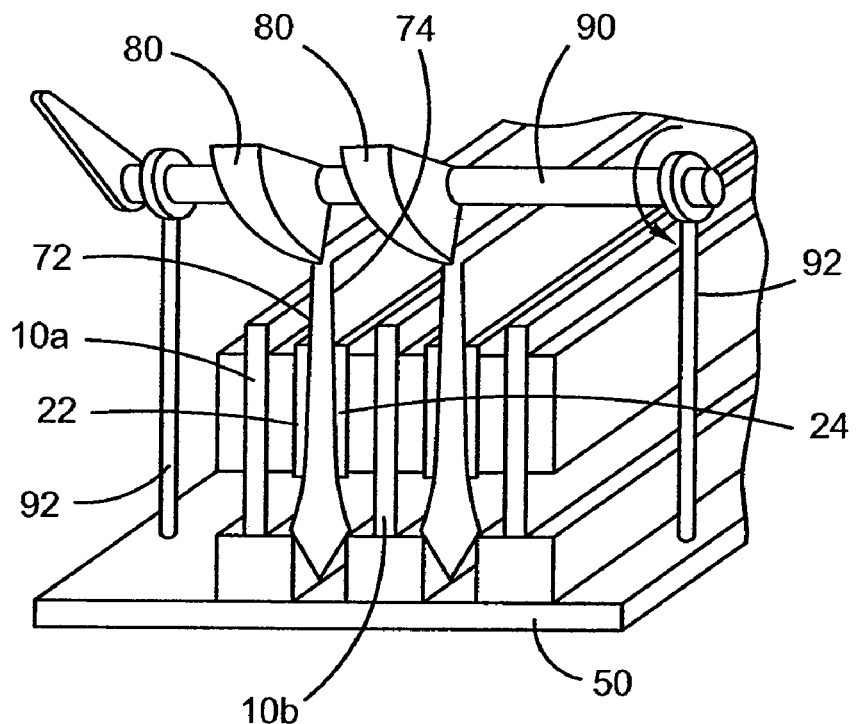
FIG. 8 is a diagrammatic side view of the heat sink of FIG. 7, shown with a lever-style wedge mechanism.

In the alternative embodiment shown in FIG. 8, the printed circuit board 50 is specially configured in accordance with the present invention to include a lever 90 pivotably mounted to the printed circuit board 50 on supports 92. The lever 90 supports the wedge member(s) 80 and is selectively pivotable between a first position, in which the wedge member 80 will not interfere with the device 20 during its insertion between adjacent memory modules 10a, 10b, and a second position, in which the wedge member 80 is interposed between the opposing legs 72, 74 to urge the first and second members 22, 24 away from one another and into contact with adjacent memory modules.

In use, this embodiment of the retention module 70 is simply manually positioned between adjacent memory modules 10a, 10b with the lever 90 in the first position. The lever 90 is then pivoted from the first position to the second position to drive the wedge(s) between the legs 72, 74 of the retention module 70. The interposition of the wedge(s) urges the first and second members 22, 24 into abutting relationship with the electronic components 12a, 12b of the adjacent memory modules 10a, 10b, and thereby provides thermal coupling of the electronic components with the heat sink device 20 to facilitate convective cooling of the memory modules 10a, 10b.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. A device for dissipating heat generated by electronic components on opposed surfaces of a pair of adjacent memory modules supported in substantially parallel positions on adjacent connectors of a printed circuit board, the device comprising:

a thermally conductive first member having a respective first surface configured to thermally couple with electronic components of a first of the pair of adjacent memory modules; and a thermally conductive second member having a respective first surface configured to thermally couple with electronic components of a second of the pair of adjacent memory modules;

said first and second members being resiliently biased away from one another to cause said first and second members to abut respective electronic components on the opposed surfaces of the adjacent memory modules; and a retention module formed as a unitary body and having a pair of opposing legs, said legs being resiliently deflectable toward one another to resiliently bias said first and second members away from one another, each one of said first and second members being mounted to a respective one of said pair of opposing legs.

2. The device of claim 1, wherein said retention module is formed of crimped sheet metal.

3. The device of claim 1, wherein said retention module has a thermal conductivity less than that of the first and second members.

4. A device for dissipating heat generated by electronic components on opposed surfaces of a pair of adjacent memory modules supported in substantially parallel positions on adjacent connectors of a printed circuit board, the device comprising;

a thermally conductive first member having a respective first surface configured to thermally couple with electronic components of a first of the pair of adjacent memory modules;

a thermally conductive second member having a respective first surface configured to thermally couple with electronic components of a second of the pair of adjacent memory modules;

said first and second members being spaced to permit insertion between said adjacent memory modules; and a wedge member selectively positionable between a first position in which said wedge member urges said first and second members away from one another and into abutting relationship with respective electronic components of said opposed surfaces of said adjacent memory modules, and a second position in which wedge member does not urge said first and second members away from one another and into said abutting relationship.

5. The device of claim 4, further comprising;

a retention module having a pair of opposing legs, each one of said first and second members being mounted to a respective one of said pair of opposing legs.

6. The device of claim 5, wherein each of said pair of opposing legs defines a plurality of openings for admitting passage of air adjacent said first and second members.

7. The device of claim 5, wherein said retention module is formed as a unitary body.

8. The device of claim 5, wherein said retention module has a thermal conductivity less than that of the first and second members.

9. The device of claim 7, wherein said retention module is formed of crimped sheet metal.

10. An information processing system comprising;
a printed circuit board supporting a pair of connectors in substantially parallel positions adjacent one another, each of said connectors being capable of receiving a respective memory module;
a pair of memory modules, each of said plurality of memory modules being mounted in a respective one of said pair of connectors, one of said plurality of memory modules supporting electronic components on a first side thereof, another of said plurality of memory modules supporting electronic components on a second side thereof, said first side facing said second side;
a device for dissipating heat generated by said electronic components, said device comprising:
a thermally conductive first member abutting said electronic components of said first side in thermal coupling therewith; and
a thermally conductive second member abutting said electronic components of said second side in thermal coupling therewith;
wherein said first and second members are resiliently deflected away from one another and into abutting relationship with said electronic components by a wedge member interposed therebetween, said wedge member being supported on said printed circuit board to pivot between a first position, in which said wedge member will not interfere with the device during its insertion between memory modules, and a second position, in which said wedge member deflects said first and second members away from one another, said deflection maintaining said first and second members in abutting relationship with said electronic components of said first and second sides of said memory modules.

11. The information processing system of claim 10, further comprising;
a lever pivotably mounted to said printed circuit board, said lever supporting said wedge member, said lever being selectively pivotable between a first position, in which said wedge member will not interfere with said device during insertion of said device between adjacent memory modules, and a second position, in which said wedge member is interposed between said opposing-legs first and second members to urge said first and second members away from one another.

12. An information processing system comprising;
a printed circuit board supporting a pair of connectors in substantially parallel positions adjacent one another, each of said connectors being capable of receiving a respective memory module;
a pair of memory modules, each of said plurality of memory modules being mounted in a respective one of said pair of connectors, one of said plurality of memory modules supporting electronic components on a first side thereof, another of said plurality of memory modules supporting electronic components on a second side thereof, said first side facing said second side;
a device for dissipating heat generated by said electronic components, said device comprising:
a thermally conductive first member abutting said electronic components of said first side in thermal coupling therewith;
a thermally conductive second member abutting said electronic components of said second side in thermal coupling therewith; and
a retention module formed as a unitary body and having a pair of opposing legs, each one of said first and second members being mounted to a respective one of said pair of opposing legs,
said wedge member comprising a discrete member interposed between said opposing legs to urge said first and second members away from one another.

13. The device of claim 12, wherein said retention module is formed of crimped sheet metal.

* * * * *